United States Patent
Yamamoto et al.

(10) Patent No.: US 7,301,189 B2
(45) Date of Patent: Nov. 27, 2007

(54) SOLID-STATE IMAGE SENSING DEVICE AND METHOD FOR MANUFACTURING THE SAME

(75) Inventors: Junichi Yamamoto, Kanagawa (JP); Yasutaka Nakashiba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 20 days.

(21) Appl. No.: 11/155,643

(22) Filed: Jun. 20, 2005

(65) Prior Publication Data
US 2006/0022230 A1 Feb. 2, 2006

(30) Foreign Application Priority Data
Jul. 27, 2004 (JP) ............... 2004-219283

(51) Int. Cl.
*H01L 31/062* (2006.01)
(52) U.S. Cl. ............... 257/292; 257/291; 257/E27.133
(58) Field of Classification Search ............... 257/233, 257/234, 291, 292, E27.133, E27.134, 443, 257/E27.13, E27.131, E27.132, 294; 438/199
See application file for complete search history.

(56) References Cited

U.S. PATENT DOCUMENTS

| | | | |
|---|---|---|---|
| 6,150,676 A * | 11/2000 | Sasaki | 257/191 |
| 6,852,565 B1 * | 2/2005 | Zhao | 438/73 |
| 2002/0054227 A1 * | 5/2002 | Hashimoto | 348/311 |
| 2005/0012167 A1 * | 1/2005 | Sawase et al. | 257/414 |

FOREIGN PATENT DOCUMENTS

JP 11-289075 10/1999

* cited by examiner

*Primary Examiner*—Sue A. Purvis
*Assistant Examiner*—Benjamin Tzu-Hung Liu
(74) *Attorney, Agent, or Firm*—Young & Thompson

(57) ABSTRACT

In the solid-state image sensing device, a first N type semiconductor region and an N well of a PMOS region are formed in the same process, thereby making the first N type semiconductor region and the N well in the PMOS region substantially equal in N type impurity concentration-depth profile. By forming the first N type semiconductor region and the N well in the same process, the number of manufacturing process for the solid-state image sensing device can be decreased. It is, therefore, possible to suppress excessive application of heat history to the solid-state image sensing device during ion implantation and diffusion of N type impurity. Accordingly, by suppressing excessive diffusion of impurity and the like resulting from the excessive application of the heat history to the solid-state image sensing device, yield of the solid-state image sensing device can be improved.

29 Claims, 11 Drawing Sheets

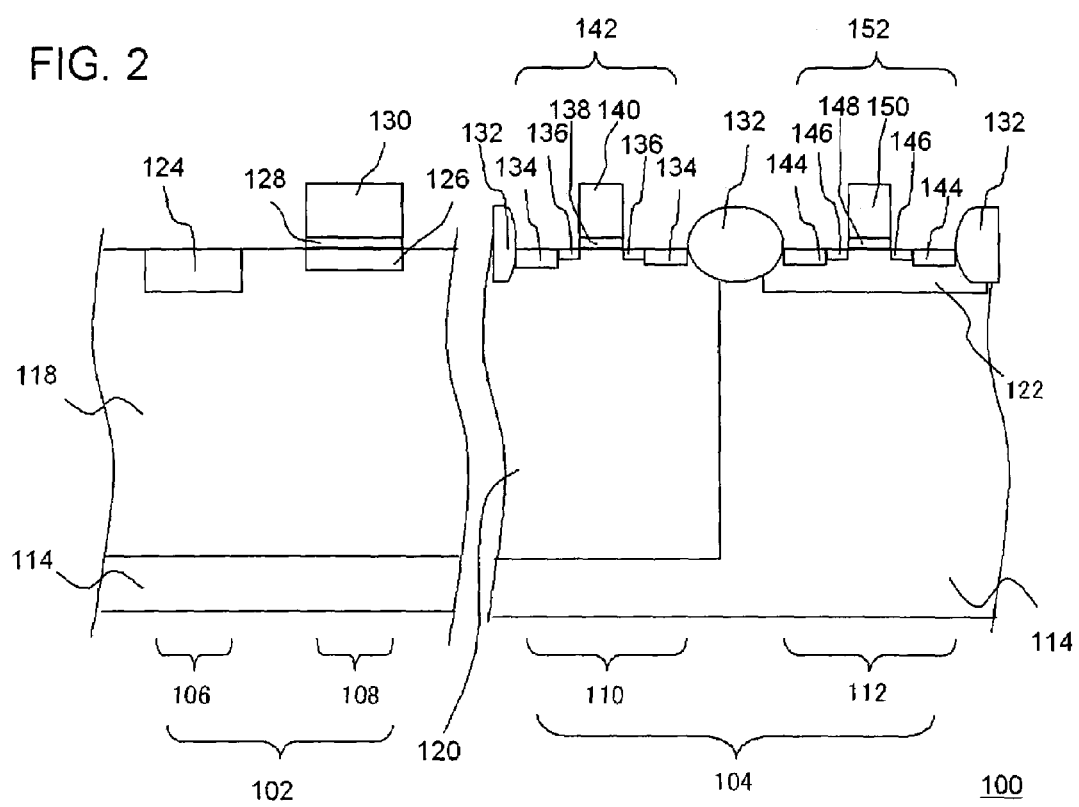

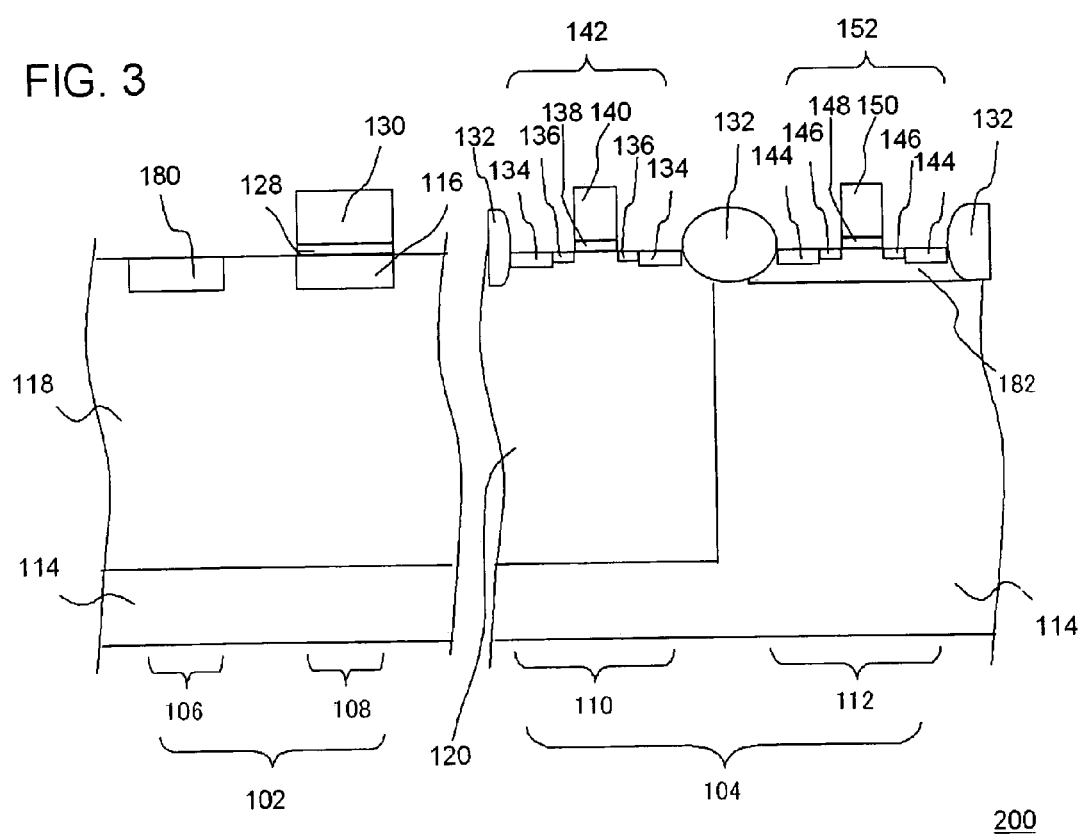

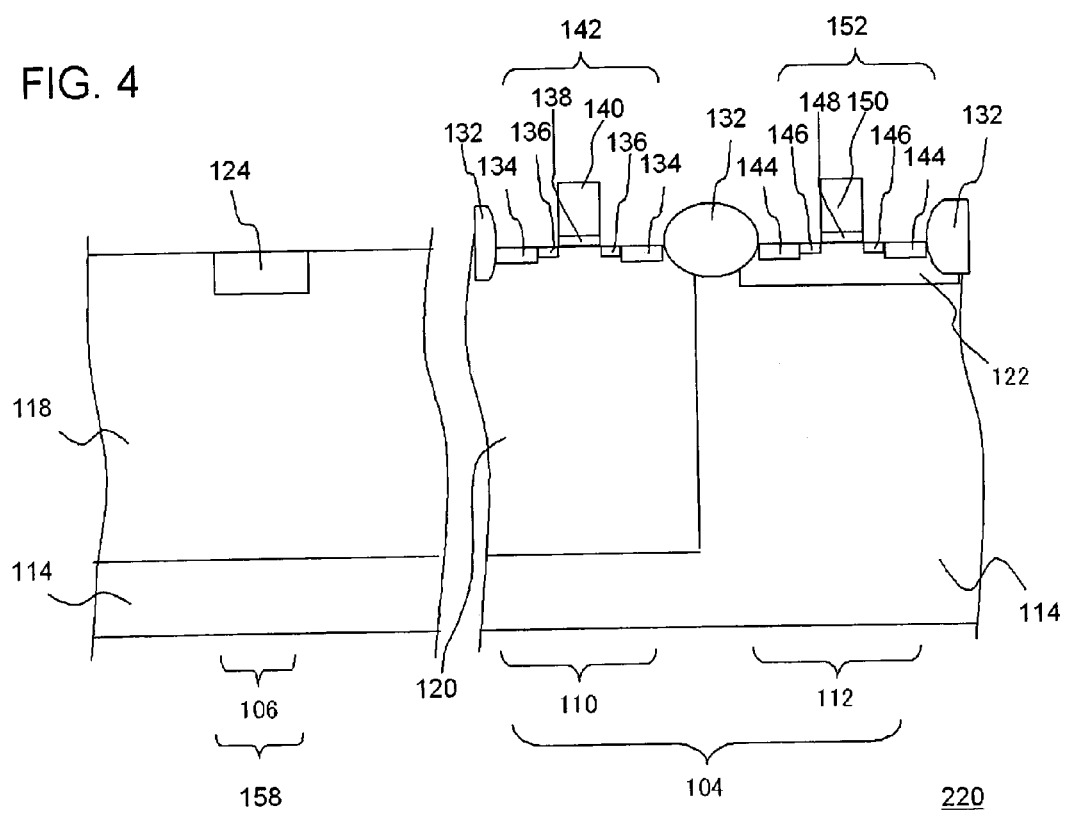

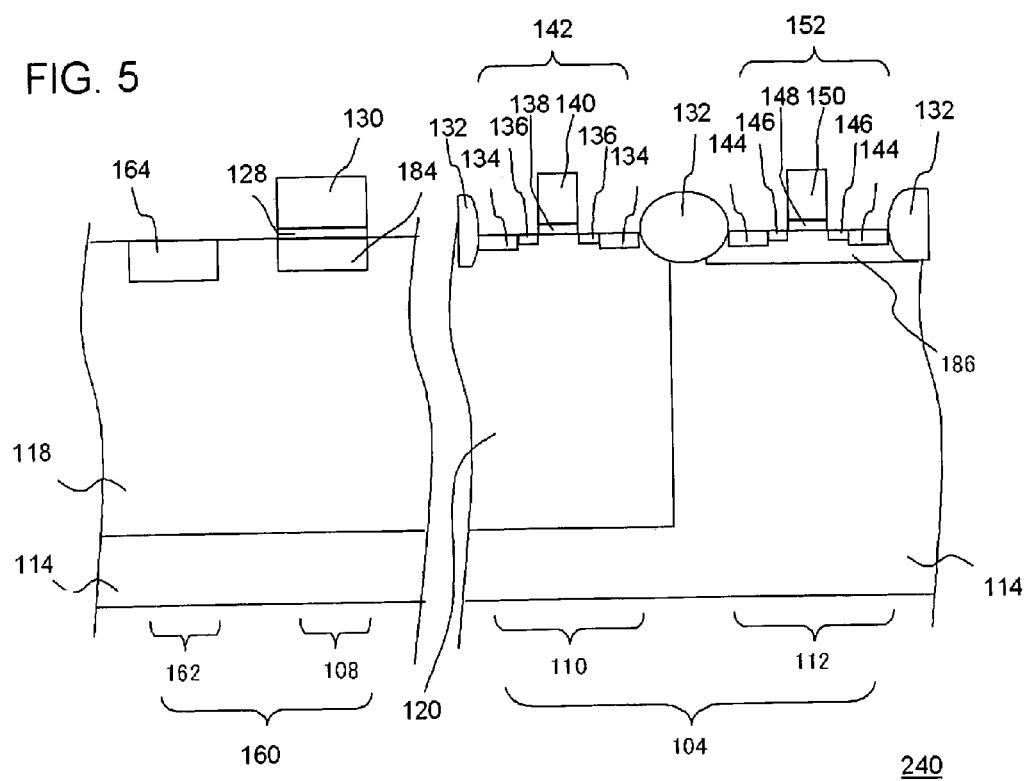

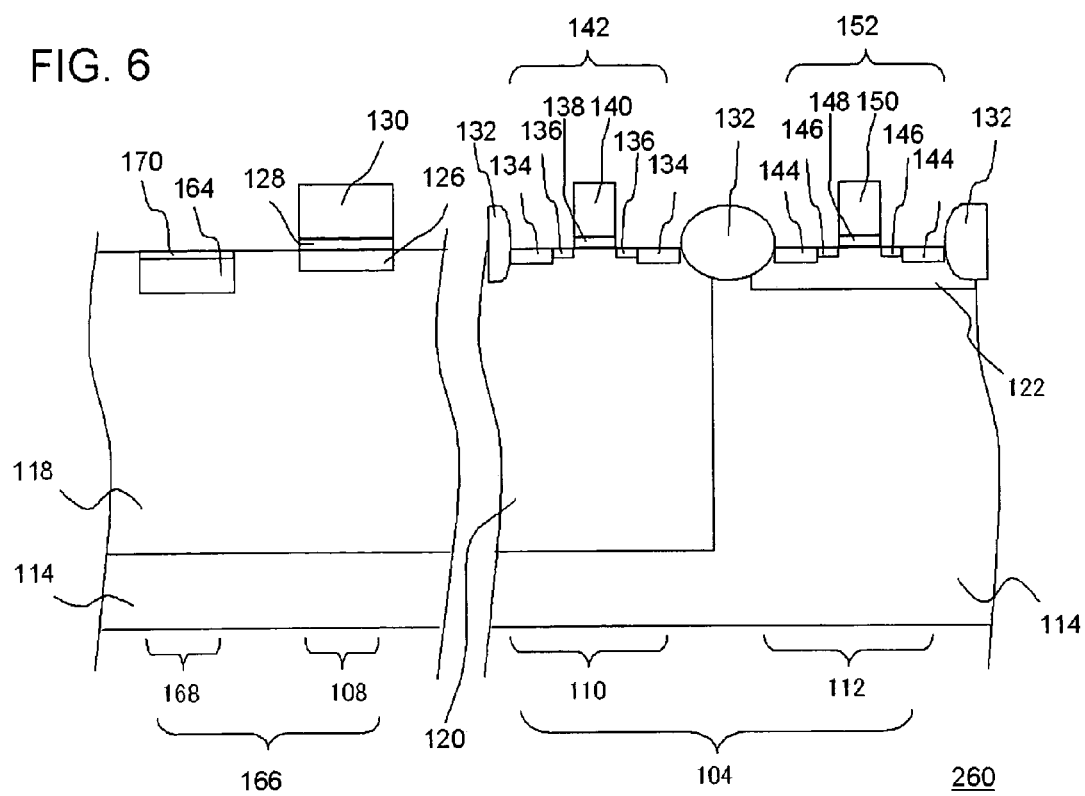

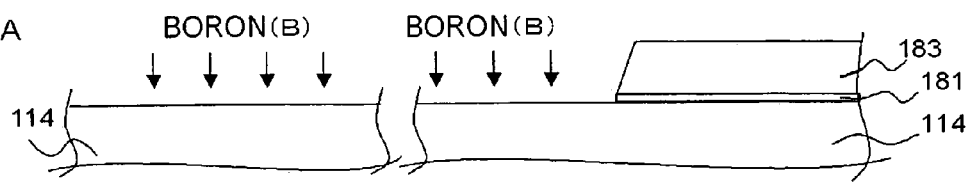
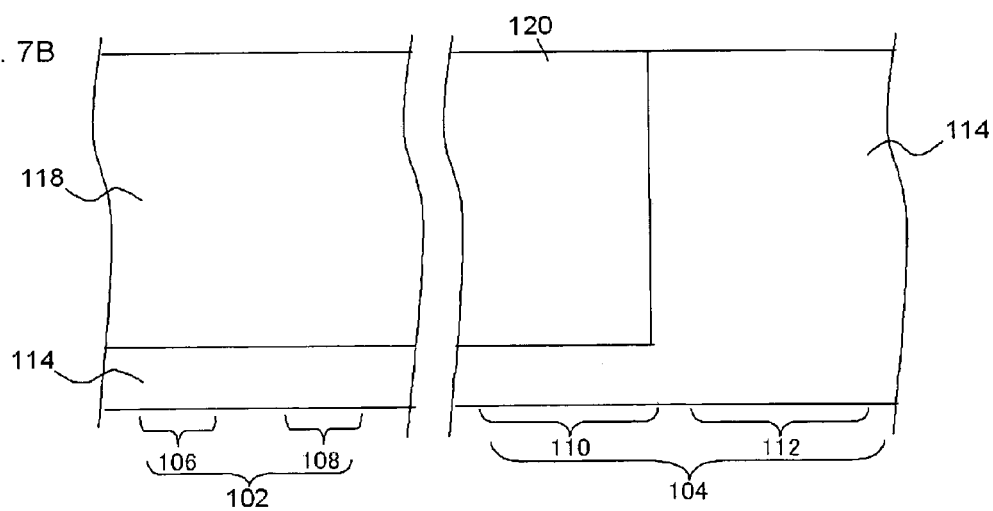
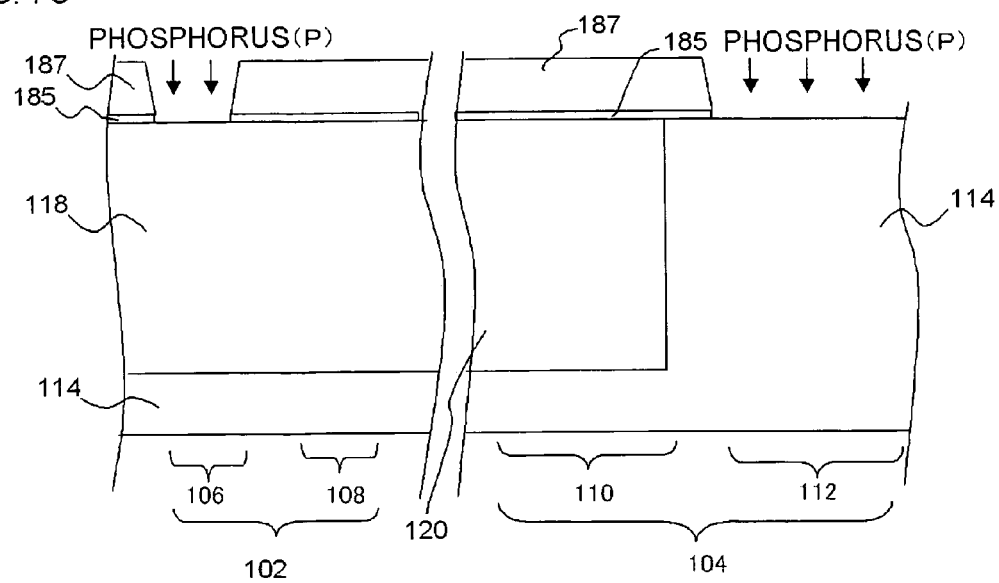

SOLID-STATE IMAGE SENSING DEVICE AND METHOD FOR MANUFACTURING THE SAME

This application is based on Japanese Patent application NO. 2004-219283, the content of which is incorporated hereinto by reference.

BACKGROUND OF THE INVENTION

1. Field of the Invention

The present invention relates to a solid-state image sensing device and method for manufacturing the same.

2. Related Art

A solid-state image sensing device configured by a PN junction photosensor and a charge transfer section has compatibility with a CMOS manufacturing process. This solid-state image sensing device is, therefore, manufactured on the same chip as that on which a CMOS circuit is formed. The CMOS circuit is employed as an output section or a peripheral circuit section in the solid-state image sensing device.

A conventional technique for the solid-state image sensing device of this type (for example, a technique described in Japanese Patent Application Laid-Open No. 1999-289075 (H11-289075)) will be described.

FIG. 11 is a cross-sectional view that exemplarily shows a conventional solid-state image sensing device 1 configured so that an image sensor section 2 that consists of a conventional PN junction photosensor section (hereinafter, "photosensor section") 6 and a charge transfer section 8, and a CMOS circuit section 4 that includes an NMOS region 10 and a PMOS region 12 are formed on the same chip.

A first N type semiconductor region 24 is formed on a face of the photosensor section 6 within a first P well 18 formed on a face of an N type semiconductor substrate 14 so as to form a PN junction. A second N type semiconductor region 26 is formed on a face of the charge transfer section 8 within the first P well 18, and a charge transfer electrode 30 is formed on the second N type semiconductor region 26 through a gate insulating film 28. In the CMOS circuit section 4, an NMOS and a PMOS are formed in two wells, that is, a second P well 20 and an N well 22, respectively. The NMOS and the PMOS are isolated from each other by a shallow trench isolation insulating film 32. The NMOS includes a gate electrode 40, a gate insulating film 38, an $N^+$ type diffusion layer 34, and an N type diffusion layer 36. The PMOS includes a gate electrode 50, a gate insulating film 48, a $P^+$ type diffusion layer 44, and a P type diffusion layer 46.

SUMMARY OF THE INVENTION

It has now been discovered that the conventional technique described in the above-stated Patent Literature has, however, a room for improvement in view of the following points.

In the conventional technique represented by the technique described in the Japanese Patent Application Laid-Open No. 1999-289075 (see FIG. 11), the first P well 18 and the second P well 20 are formed in different process. In addition, the first N type semiconductor region 24, the second N type semiconductor region 26, and the N well 22 are formed in different process. As a result, there is room for improvement, in view of the number of process increases and excessive heat history is applied to the solid-state image sensing device 1.

The Japanese Patent Application Laid-Open No. 1999-289075 discloses that the P well of the image sensor section and the P well of the CMOS circuit section are formed in the same process. However, as for the image sensor section, only a MOS gate type photosensor is referred to and no mention is made of a PN junction type photosensor. Thus, an N type semiconductor region for forming the PN junction type photosensor is not at all disclosed therein.

According to the present invention, there is provided a solid-state image sensing device comprising: a semiconductor substrate; an image sensor section formed on the semiconductor substrate and including a PN junction type photosensor; and a CMOS circuit section formed on the semiconductor substrate, wherein the image sensor section comprises: a second conductivity type well; and a first first-conductivity-type semiconductor region formed within the second conductivity type well, and constituting the PN junction type photosensor, the CMOS circuit section comprises: a first conductivity type well; and a second conductivity type MOS transistor formed within the first conductivity type well, and the first conductivity type well and the first first-conductivity-type semiconductor region have substantially same impurity concentration-depth profile.

According to the present invention, the first conductivity type well and the first first-conductivity-type semiconductor region are configured to be substantially equal in impurity concentration-depth profile and to be able to be formed in the same process. It is, therefore, possible to decrease the number of manufacturing process for the solid-state image sensing device, and suppress excessive application of heat history to the solid-state image sensing device during ion implantation and diffusion of first conductivity type impurity. The solid-state image sensing device capable of realizing high yield can be, therefore, provided.

According to the present invention, there is provided a solid-state image sensing device comprising: a semiconductor substrate; an image sensor section formed on the semiconductor substrate and including a PN junction type photosensor; and a CMOS circuit section formed on the semiconductor substrate, wherein the image sensor section comprises: a second conductivity type well; a first first-conductivity-type semiconductor region formed within the second conductivity type well, and constituting the PN junction type photosensor; a charge transfer section; and a second first-conductivity-type semiconductor region formed within the second conductivity type well in the charge transfer section, the CMOS circuit section comprises: a first conductivity type well; and a second conductivity type MOS transistor formed within the first conductivity type well, and the first conductivity type well and the second first-conductivity-type semiconductor region have substantially same impurity concentration-depth profile.

According to the present invention, the first conductivity type well and the second first-conductivity-type semiconductor region are configured to be substantially equal in impurity concentration-depth profile and to be able to be formed in the same process. It is, therefore, possible to decrease the number of manufacturing process for the solid-state image sensing device, and suppress excessive application of heat history to the solid-state image sensing device during ion implantation and diffusion of first conductivity type impurity. The solid-state image sensing device capable of realizing high yield can be, therefore, provided.

According to the present invention, there is provided a method for manufacturing a solid-state image sensing device that comprises an image sensor section including a PN junction type photosensor, and a CMOS circuit section, the image sensor section and the CMOS circuit section formed on a semiconductor substrate, the method comprising: forming a first second-conductivity-type well in the image sensor section on a face of the semiconductor substrate, and forming a second second-conductivity-type well in a first conductivity type MOS transistor forming region, in the CMOS circuit section; and forming a first conductivity type well in a second conductivity type MOS transistor forming region, on the face of the semiconductor substrate simultaneously with forming a first first-conductivity-type semiconductor region within the first second-conductivity-type well in the image sensor section.

According to the present invention, the first first-conductivity-type semiconductor region and the first conductivity type well are formed in the same process. The solid-state image sensing device having high yield can be thereby efficiently manufactured by simple process.

According to the present invention, there is provided a method for manufacturing a solid-state image sensing device that comprises an image sensor section including a PN junction type photosensor and a charge transfer section, and a CMOS circuit section, the image sensor section and the CMOS circuit section formed on a semiconductor substrate, the method comprising: forming a first second-conductivity-type well in the image sensor section on a face of the semiconductor substrate, and forming a second second-conductivity-type well in a first conductivity type MOS transistor forming region, in the CMOS circuit section; forming a first first-conductivity-type semiconductor region within the first second-conductivity-type well in a region in which the PN junction type photosensor is formed; forming a second first-conductivity-type semiconductor region within the first second-conductivity-type well in a region in which the charge transfer section is formed; and forming a first conductivity type well in a second conductivity type MOS transistor forming region, on the face of the semiconductor substrate, wherein the first first-conductivity-type semiconductor region, the second first-conductivity-type semiconductor region, and the first conductivity type well are simultaneously formed.

According to the present invention, the first first-conductivity-type semiconductor region, the second first-conductivity-type semiconductor region, and the first conductivity type well are simultaneously formed. The solid-state image sensing device having high yield can be thereby efficiently manufactured by simple process.

According to the present invention, there is provided a method for manufacturing a solid-state image sensing device that comprises an image sensor section including a PN junction type photosensor and a charge transfer section, and a CMOS circuit section, the image sensor section and the CMOS circuit section formed on a semiconductor substrate, the method comprising: forming a first second-conductivity-type well in the image sensor section on a face of the semiconductor substrate; forming a second second-conductivity-type well in a first conductivity type MOS transistor forming region, in the CMOS circuit section; forming a first first-conductivity-type semiconductor region that constitutes the PN junction type photosensor, within the first second-conductivity-type well in the image sensor section; and forming a first conductivity type well in a second conductivity type MOS transistor forming region on the face of the semiconductor substrate simultaneously with forming a second first-conductivity-type semiconductor region in a region in which the charge transfer section is formed within the first second-conductivity-type well in the image sensor section.

According to the present invention, the second first-conductivity-type semiconductor region and the first conductivity type well are formed in the same process. The solid-state image sensing device having high yield can be thereby efficiently manufactured by simple process.

According to the present invention, in the solid-state image sensing device including the PN junction type photosensor and the CMOS circuit on the same chip, the solid-state image sensing device with high yield can be provided.

BRIEF DESCRIPTION OF THE DRAWINGS

The above and other objects, advantages and features of the present invention will be more apparent from the following description taken in conjunction with the accompanying drawings, in which:

FIG. 2 is a cross-sectional view that schematically shows a solid-state image sensing device according to the embodiment of the present invention;

FIG. 3 is a cross-sectional view that schematically shows a solid-state image sensing device according to the embodiment of the present invention;

FIG. 4 is a cross-sectional view that schematically shows a solid-state image sensing device according to an embodiment of the present invention;

FIG. 5 is a cross-sectional view that schematically shows a solid-state image sensing device according to an embodiment of the present invention;

FIG. 6 is a cross-sectional view that schematically shows a solid-state image sensing device according to an embodiment of the present invention;

FIGS. 7A to 7C are cross-sectional process views that schematically show manufacturing process for the solid-state image sensing device according to the embodiment of the present invention;

DETAILED DESCRIPTION OF THE INVENTION

Figure 1:
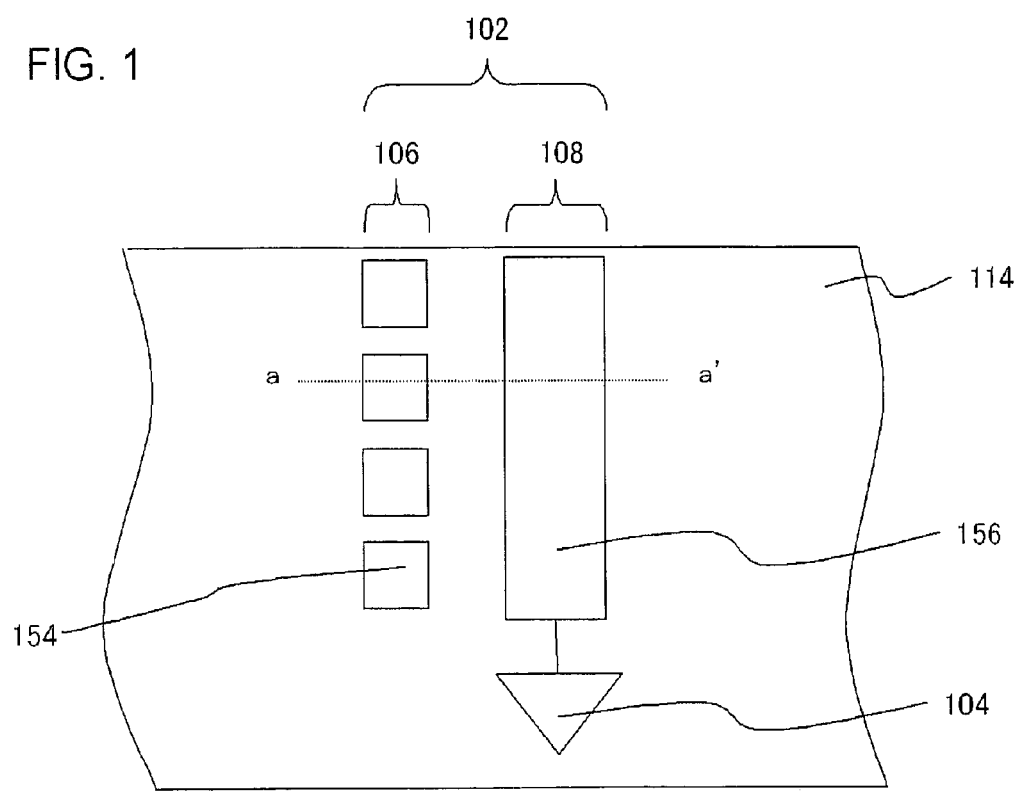
FIG. 1 is a plan view that schematically shows a solid-state image sensing device according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of the present invention will be described hereinafter with reference to the drawings. Like constituent elements are denoted by the same reference symbols throughout the drawings, and they will not be described repeatedly.

A solid-state image sensing device according to each embodiment to be described hereafter includes an image sensor section and a CMOS circuit section on the same semiconductor chip. The image sensor section includes a PN junction type photosensor section (hereinafter, "photosensor section"). The image sensor section of each solid-state image sensing device except for the solid-state image sensing device according to a third embodiment also includes a charge transfer section. The CMOS circuit section operates as an output circuit or a peripheral circuit from the charge transfer section. The solid-state image sensing device according to the embodiments of the present invention will be described.

Referring to FIG. 2, a solid-state image sensing device 100 comprises a semiconductor substrate (an N type semiconductor substrate 114), an image sensor section 102 including a PN junction type photosensor (photosensor section 106) formed on the semiconductor substrate, and a CMOS circuit section 104 formed on the semiconductor substrate. The image sensor section 102 includes a second conductivity type well (P well 118), and a first first-conductivity-type semiconductor region (first N type semiconductor region 124) formed within the second conductivity type well and constituting the PN junction type photosensor. The CMOS circuit section 104 includes a first conductivity type well (N well 122) and a second conductivity type MOS transistor (PMOS transistor 152) formed within the first conductivity type well. The first conductivity type well and the first first-conductivity-type semiconductor region have substantially same impurity concentration-depth profile.

Referring to FIG. 5, a solid-state image sensing device 240 includes a semiconductor substrate (an N type semiconductor substrate 114), an image sensor section 160 including a PN junction type photosensor (photosensor section 162) formed on the semiconductor substrate, and a CMOS circuit section 104 formed on the semiconductor substrate. The image sensor section 160 includes a second conductivity type well (P well 118), a first first-conductivity-type semiconductor region (first N type semiconductor region 164) formed within the second conductivity type well and constituting the PN junction type photosensor, a charge transfer section 108, and a second first-conductivity-type semiconductor region (second N type semiconductor region 184) formed within the second conductivity type well in the charge transfer section 108. The CMOS circuit section 104 includes a first conductivity type well (N well 186) and a second conductivity type MOS transistor (PMOS transistor 152) formed within the first conductivity type well. The first conductivity type well and the second first-conductivity-type semiconductor region have substantially same impurity concentration-depth profile.

First Embodiment

FIG. 1 is a schematic plan view of the solid-state image sensing device 100 according to the present embodiment. The image sensor section (region) 102 of the solid-state image sensing device 100 includes the photosensor section (region) 106 including a plurality of photodiodes 154 formed on the N type semiconductor substrate 114 that is the first conductivity type semiconductor substrate, and the charge transfer section 108 including a charge-coupled device (CCD) shift register 156. The charge transfer section (region) 108 is connected to an output section consisting of the CMOS circuit section (region) 104 formed on the N type semiconductor substrate 114, that is, on the same substrate. While an instance in which the solid-state image sensing device is a one-dimensional CCD is shown in FIG. 1, the present invention is similarly applicable to a two-dimensional CCD.

FIG. 2 is a schematic cross-sectional view of the solid-state image sensing device 100 according to the present embodiment. The cross section of the image sensor section 102 is taken along a line a-a' of FIG. 1.

In the image sensor section 102, the P well 118 that is the second conductivity type well is formed on a face of the N type semiconductor substrate 114. In the CMOS circuit section 104, a P well 120 is formed in a region in which an NMOS transistor 142 that constitutes the CMOS circuit is formed (hereinafter, "NMOS region 110"), and the NMOS transistor 142 is formed within the P well 120. In this embodiment, the P well 118 of the image sensor section 102 and the P well 120 of the NMOS region 110 are implanted with ions of P type impurity, for example, boron in the same process, and substantially equal in P type impurity concentration-depth profile. In this embodiment, a depth of each of the P well 118 and the P well 120 is about six to eight micrometers from the face of the N type semiconductor substrate 114, and a concentration of the P type impurity such as boron of the P well 118 and the P well 120 is about $1E15$ $cm^{-3}$ (where symbol 'En' indicates an $n^{th}$ power of 10 (10 to the n power), the same shall apply hereafter) in vicinity of (near) faces of the P well 118 and the P well 120.

The P type impurity concentration can be measured by a secondary ion mass spectrometer (SIMS). The expression "substantially same impurity concentration-depth profile" means that impurity concentrations at points of the same depth are substantially equal. The expression "substantially same" is intended to allow fluctuation in the depth profile when the impurity is implanted into two or more regions in the same process.

The first N type semiconductor region 124 that is the first first-conductivity-type semiconductor region is formed on a face of the photosensor section 106 within the P well 118. The first N type semiconductor region 124 and the P well 118 constitute the PN junction type photosensor. In the CMOS circuit section 104, the N well 122 that is the first conductivity type well an impurity concentration thereof is higher than an impurity concentration of the N type semiconductor substrate 114 is formed within a region in which the PMOS transistor 152 that is the second conductivity type MOS transistor constituting the CMOS circuit is formed (hereinafter, "PMOS region") 112, and the PMOS transistor 152 is formed within the N well 122. In this embodiment, the first N type semiconductor region 124 and the N well 122 are implanted with ions of N type impurity, for example, phosphorus in the same process, and are substantially equal in N type impurity concentration-depth profile. A depth of each of the first N type semiconductor region 124 and the N well 122 is, for example, about 1 to 1.1 micrometers from the face of the N type semiconductor substrate 114. A concentration of the N type impurity such as phosphorus in vicinity of a face of each of the first N type semiconductor region 124 and the N well 122 is, for example, about $1E16$ $cm^{-3}$. That is, a depth of the N well 122 is shallower than a depth of the P well 118 and the P well 120. The N type impurity concentration can be measured by the secondary ion mass spectrometer (SIMS). The expression "substantially equal (substantially same)" is intended to allow fluctuation on manufacturing process.

Further, a second N type semiconductor region 126 that is the second first-conductivity-type semiconductor region is formed in vicinity of the face of the charge transfer section 108 within the P well 118. The second N type semiconductor region 126 is implanted with ions of N type impurity, for example, phosphorus, and formed in a different process from the process of forming the first N type semiconductor region 124 and the N well 122. That is, the second N type semiconductor region 126 differs in N type impurity concentration-depth profile from the first N type semiconductor region 124 and the N well 122. For example, a depth of the second N type semiconductor region 126 is about 0.5 micrometer and a phosphorus concentration in vicinity of the face of the second N type semiconductor region 126 is about $1E16$ cm$^{-3}$. As such, the depth of the second N type semiconductor region 126 may be shallower than the depth of the first N type semiconductor region 124. It is noted that a charge transfer electrode 130 consisting of polysilicon is formed on the second N type semiconductor region 126 through a gate insulating film 128.

In the CMOS circuit section 104, an N type diffusion layer 136 and an N$^+$ type diffusion layer 134 that serve as a source and a drain are formed on a face of the NMOS region 110 within the P well 120. A gate electrode 140 consisting of polysilicon is formed on the face of the NMOS region 110 through a gate insulating film 138 formed on the face of the N type semiconductor substrate 114. The N type diffusion layer 136, the N$^+$ type diffusion layer 134, and the gate electrode 140 constitute the NMOS transistor 142. Likewise, a P type diffusion layer 146 and a P$^+$ type diffusion layer 144 that serve as a source and a drain are formed on a face of the PMOS region 112 within the N well 122. A gate electrode 150 consisting of polysilicon is formed on the face of the PMOS region 112 through a gate insulating film 148 formed on the face of the N type semiconductor substrate 114. The P type diffusion layer 146, the P$^+$ type diffusion layer 144, and the gate electrode 150 constitute the PMOS transistor 152. It is noted that the NMOS transistor 142 and the PMOS transistor 152 are isolated from each other by a shallow trench isolation insulating film 132.

The gate insulating film 128 on the second N type semiconductor region 126 of the charge transfer section 108, the gate insulating film 138 of the NMOS transistor 142, and the gate insulating film 148 of the PMOS transistor 152 may be formed in the same process. For example, a thickness of each of the gate insulating film 128, the gate insulating film 138, and the gate insulating film 148 is about 0.08 micrometer and a material therefore is a silicon oxide film. Alternatively, with a view of improving characteristics of the gate insulating films, the respective gate insulating film 128, the gate insulating film 138, and the gate insulating film 148 may be formed in different process and may differ in thickness and material.

To suppress latch-up, it is preferable that the P well 120 and the N well 122 are formed to be apart from each other by about six micrometers in the CMOS circuit section 104. It is also preferable that the NMOS transistor 142 is formed to be apart by about eight micrometers from each end of the P well 120 within the P well 120. Likewise, the PMOS transistor 152 is preferably formed to be apart by about eight micrometers from each end of the N well 122 within the N well 122.

Referring to FIGS. 7A to 8B, a method for manufacturing the solid-state image sensing device 100 will be described.

As shown in FIG. 7A, an oxide film 181 and a photoresist 183 are formed on the entire face of the N type semiconductor substrate 114 except for regions that serve as the image sensor section 102 and the NMOS region 110, respectively. The region that serves as the image sensor section 102 and the region that serves as the NMOS region 110 are selectively implanted with ions of P type impurity, for example, boron at implantation energy of about 150 keV and at an amount of implantation of about $1.5E12$ cm$^{-2}$.

Next, as shown in FIG. 7B, the oxide film 181 and the photoresist 183 are removed and heat treatment is then performed, thereby forming the P well 118 in the image sensor section 102 and forming the P well 120 in the NMOS region 110. It is noted that the P well 118 that is the first second-conductivity-type well and the P well 120 that is the second second-conductivity-type well are simultaneously formed in the same process by performing ion implantation. By doing so, the P well 118 and the P well 120 each having a depth of about six to eight micrometers and a concentration of P type impurity such as boron in vicinity of the face of about $1E15$ cm$^{-3}$ are formed while considering an influence of the heat treatment on later process.

Next, as shown in FIG. 7C, an oxide film 185 and a photoresist 187 are formed on the entire face of the N type semiconductor substrate 114 except for the photosensor section 106 and the PMOS region 112. The photosensor section 106 and the PMOS region 112 are selectively implanted with ions of N type impurity, for example, phosphorus at implantation energy of about 80 keV and an amount of implantation of about $3E12$ cm$^{-2}$ at same time.

Figure 8A:
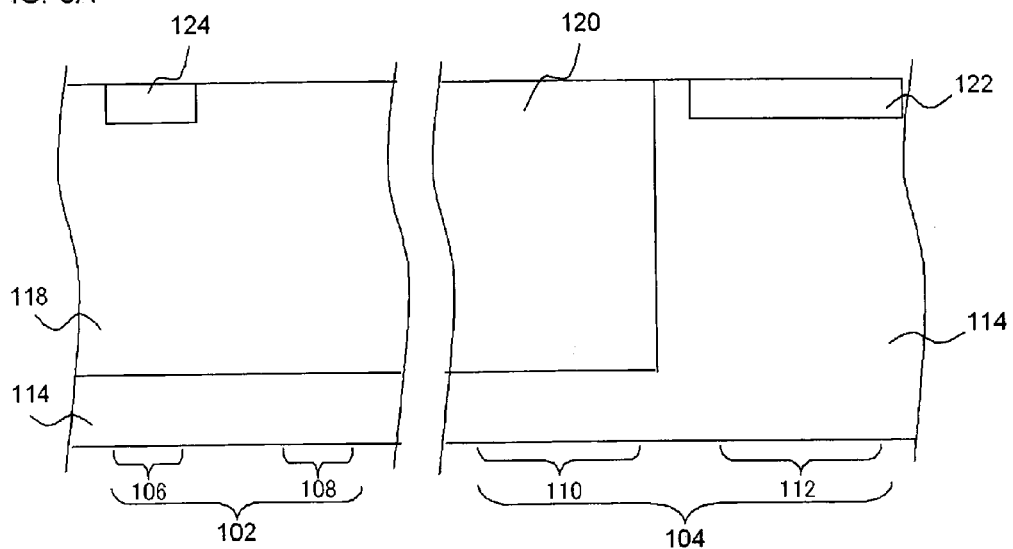
FIGS. 8A to 8B are cross-sectional process views that schematically show manufacturing process for the solid-state image sensing device according to the embodiment of the present invention.

Then, as shown in FIG. 8A, the oxide film 185 and the photoresist 187 are removed and heat treatment is then performed, thereby simultaneously forming the first N type semiconductor region 124 in the photosensor section 106 and the N well 122 in the PMOS region 112 in the same process. By doing so, the first N type semiconductor region 124 and the N well 122 each having a depth of about one micrometer and the concentration of N type impurity such as phosphorus in vicinity of the face of about $1E16$ cm$^{-3}$ are formed while considering the influence of the heat treatment on later process.

Figure 8B:
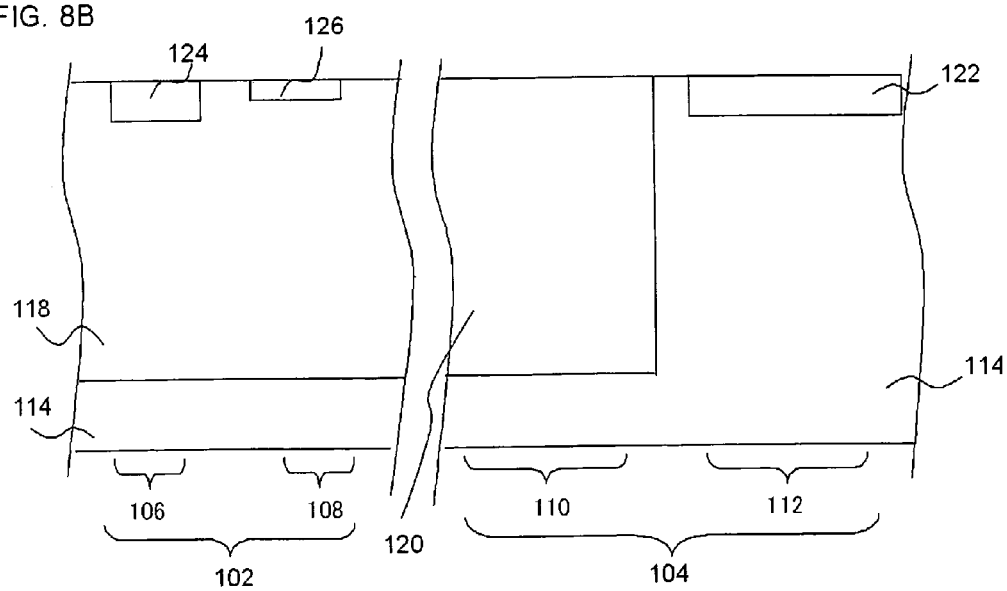

Likewise, as shown in FIG. 8B, the second N type semiconductor region 126 in the charge transfer section 108 is formed by selective ion implantation using an oxide film (not shown in the drawings) and a photoresist (not shown in the drawings) and heat treatment. In this ion implantation, the second N type semiconductor region 126 is implanted with ions of N type impurity, for example, phosphorus at implantation energy of about 80 keV and an amount of an implantation of about $2E12$ cm$^{-2}$. By doing so, the second N type semiconductor region 126 having a depth of about 0.5 micrometer and a phosphorus concentration in vicinity of the face of about $1E16$ cm$^{-3}$ is formed. As such, the second N type semiconductor region 126 is formed in the process different from the process of forming the first N type semiconductor region 124 and the N well 122. The second N type semiconductor region 126, therefore, differs in N type impurity concentration-depth profile from the first N type semiconductor region 124 and the N well 122.

Next, using a known process, the shallow trench isolation insulating film 132, the N type diffusion layer 136 and the N$^+$ type diffusion layer 134 that serve as the source and the drain of the NMOS transistor 142 in the CMOS circuit section 104, and the P type diffusion layer 146 and the P$^+$ type diffusion layer 144 that serve as the source and the drain of the PMOS transistor 152 in the CMOS circuit section 104 are formed. The gate insulating film 128 of the charge transfer section 108, the gate insulating film 138 of the NMOS transistor 142, and the gate insulating film 148 of the PMOS transistor 152 are formed. Further, the charge transfer electrode 130 of the charge transfer section 108, the gate electrode 140 of the NMOS transistor 142, and the gate electrode 150 of the PMOS transistor 152 are formed (see FIG. 2). Through this process, the solid-state image sensing device 100 can be manufactured.

The gate insulating film 128 on the second N type semiconductor region 126 of the charge transfer section 108, the gate insulating film 138 of the NMOS transistor 142, and the gate insulating film 148 of the PMOS transistor 152 may be formed in either the same process or different process. If they are formed in the same process, the number of process can be further decreased. If they are formed in the different process, their respective characteristics can be further improved. Likewise, the charge transfer electrode 130 of the charge transfer section 108, the gate electrode 140 of the NMOS transistor 142, and the gate electrode 150 of the PMOS transistor 152 may be formed in either the same process or different process. If they are formed in the same process, the number of process can be further decreased. If they are formed in the different process, their respective characteristics can be further improved.

Hereinafter, advantages of the solid-state image sensing device 100 and the manufacturing method therefore will now be described.

Figure 11:
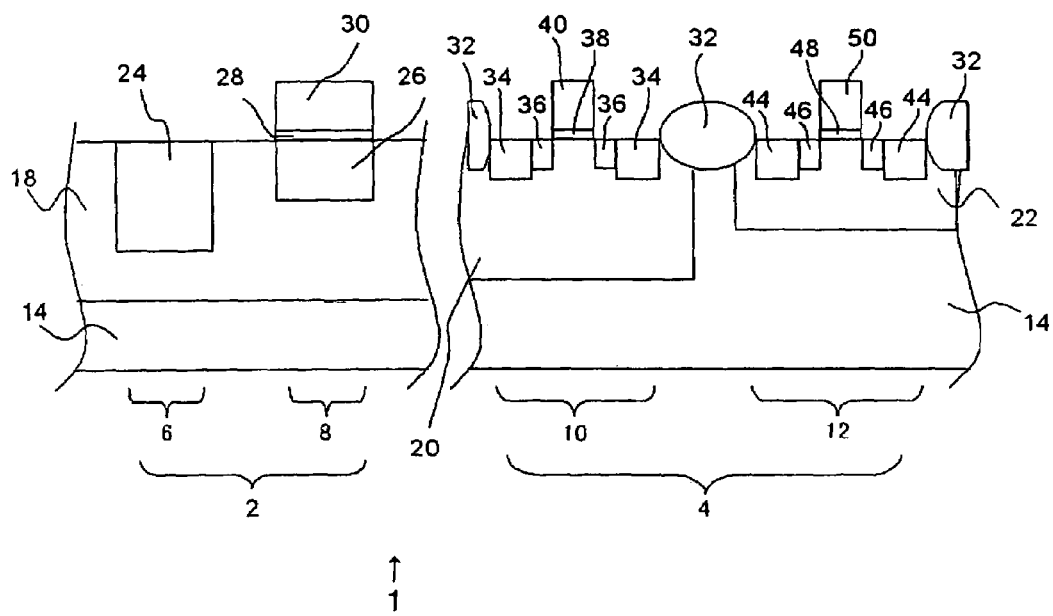
FIG. 11 is a cross-sectional view that schematically shows a conventional solid-state image sensing device.

In the conventional technique shown in FIG. 11, the first N type semiconductor region 24 differs from the N well 22 of the PMOS region 12 in N type impurity concentration-depth profile. That is, it is required that the first N type semiconductor region 24 and the N well 22 of the PMOS region have different N type impurity concentration-depth profiles so as to satisfy a demand of providing the first N type semiconductor region 24 and the N well 22 with appropriate characteristics, respectively. For this reason, the first N type semiconductor region 24 and the N well 22 are formed in the different process. Further, it is general that the second P well 20 and the N well 22 that are two wells of the CMOS circuit section 4 are designed to be substantially equal in depth. On the contrary, the inventor discovered the following points. According to this embodiment, the ion implantation conditions described in this embodiment are adopted and the impurity concentration profile is optimized. By doing so, even if the first N type semiconductor region 124 and the N well 122 are formed in the same process and have substantially same N type impurity concentration-depth profile, good characteristics of the image sensor section 102 and the CMOS circuit section 104 that function as part of the solid-state image sensing device 100 can be kept. Therefore, even if the first N type semiconductor region 124 and the N well 122 are equal in impurity concentration profile, the solid-state image sensing device 100 can function satisfactorily. In addition, the inventor discovered even if the depth of the P well 120 differs the depth of the N well 122, the characteristics of the P well 120 and the N well 122 that function as part of the CMOS circuit section 104 can be kept more satisfactorily, therefore, even if the depth of the P well 118 and the depth of the P well 120 differ from the depth of the N well 122, the CMOS circuit section 104 can function satisfactorily. The present invention has been achieved based on this knowledge. The first N type semiconductor region 124 and the N well 122 of the PMOS region 112 in the solid-state image sensing device 100 are formed in the same process. The first N type semiconductor region 124 and the N well 122 of the PMOS region 112 have thereby made substantially same N type impurity concentration-depth profile. By forming the first N type semiconductor region 124 and the N well 122 in the same process, since the number of manufacturing process for the solid-state image sensing device 100 can be reduced, it is possible to suppress excessive application of heat history to the solid-state image sensing device 100 during the ion implantation and diffusion of N type impurity. By suppressing the excessive diffusion of impurity and the like resulting from the excessive application of the heat history, yield of the solid-state image sensing device 100 can be improved.

Further, by forming the P well 118 of the image sensor section 102 and the P well 120 of the NMOS region 110 in the same process, the P well 118 and the P well 120 can be made substantially equal in P type impurity concentration-depth profile. In this case, by forming the P well 118 and the P well 120 in the same process, the number of manufacturing process for the solid-state image sensing device 100 can be further reduced. It is, therefore, possible to more effectively suppress the application of the excessive heat history to the solid-state image sensing device 100 during implantation of ions of P type impurity. Even if the P well 118 and the P well 120 are formed in the same process and substantially equal in P type impurity concentration-depth profile, the characteristics of the image sensor section 102 and the CMOS circuit section 104 that function as part of the solid-state image sensing device 100 can be kept more satisfactorily. Accordingly, by suppressing the diffusion of impurity and the like resulting from the excessive application of heat history more effectively, the yield of the solid-state image sensing device 100 can be further improved. In addition, since the number of manufacturing process can be reduced, a manufacturing cost reduction of the solid-state image sensing device 100 can be realized.

Moreover, in the method for manufacturing the solid-state image sensing device 100, the first N type semiconductor region 124 of the photosensor section 106 and the N well 122 of the PMOS region 112 are formed in the same process. It is thereby possible to decrease the number of manufacturing process. The cost of the solid-state image sensing device 100 can be reduced, accordingly.

Second Embodiment

In the first embodiment, the instance in which the first N type semiconductor region 124 and the N well 122 are formed in the same process and in which the second N type semiconductor region 126 is formed in the different process from the process of forming the first N type semiconductor region 124 and the N well 122 has been described. In the present embodiment, as shown in FIG. 3, a solid-state image sensing device 200 having a first N type semiconductor region 180, an N well 182, and a second N type semiconductor region 116 formed in the same process, that is, formed under the same ion implantation conditions or the like will be described. The solid-state image sensing device 200 is substantially equal in the other configurations and the other manufacturing process to the solid-stat imaging device 100 according to the first embodiment.

In this embodiment, the first N type semiconductor region 180, the N well 182, and the second N type semiconductor region 116 have substantially same N type impurity concentration-depth profile. For example, a depth of each of the first N type semiconductor region 180, a depth of the N well 182, and a depth of the second N type semiconductor region 116 is about 0.8 micrometer, and a concentration of the N type impurity in vicinity of the face is about $1E16$ $cm^{-3}$ The expression "substantially same" is intended to allow fluctuation on manufacturing process.

A method for manufacturing the solid-state image sensing device 200 according to this embodiment will be described.

In this embodiment, the process shown in FIGS. 7A to 7B described in the first embodiment is employed.

Figure 9:
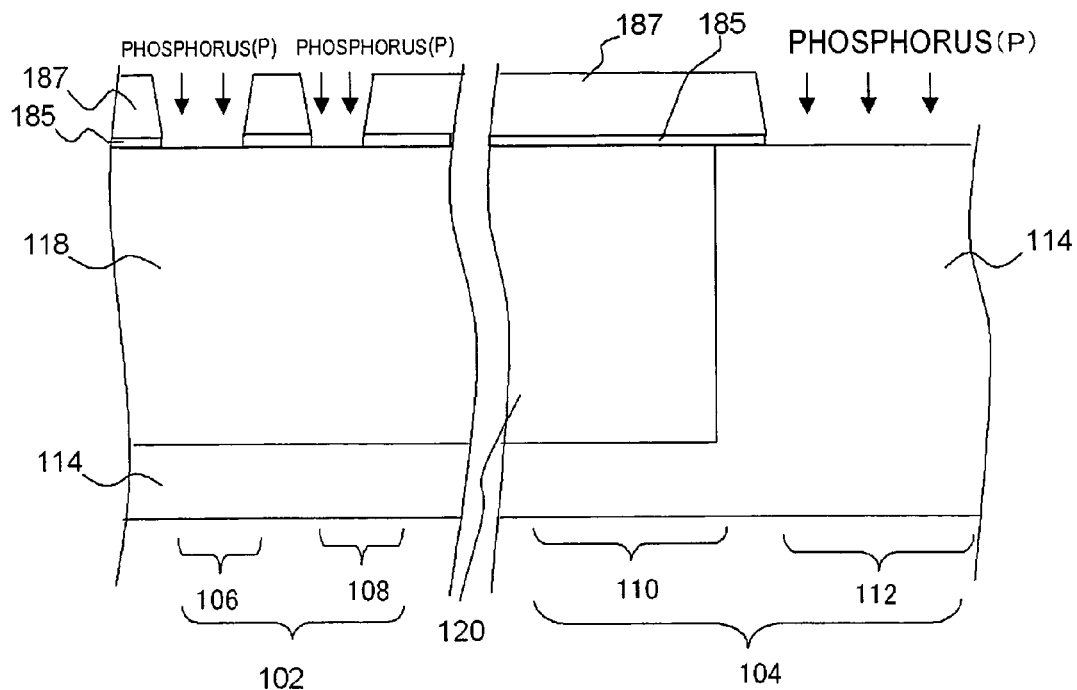
FIG. 9 is a cross-sectional process view that schematically shows manufacturing process for the solid-state image sensing device according to the embodiment of the present invention.

Next, the first N type semiconductor region 180 of the photosensor section 106, the N well 182 of the PMOS region 112, and the second N type semiconductor region 116 of the charge transfer section 108 are simultaneously formed in the same process, that is, under conditions of the same ion implantation energy, the same amount of ion implantation, and the like. For example, ions of N type impurity, for example, phosphorus are implanted at ion implantation energy of about 80 keV and an amount of an ion implantation of about 3E12 $cm^{-2}$ (see FIG. 9). As a result, the first N type semiconductor region 180, the N well 182, and the second N type semiconductor region 116 each having a depth of, for example, about 0.8 micrometer and a concentration of N type impurity such as phosphorus in vicinity of the face of, for example, about 1E16 $cm^{-3}$ are formed. Next, using a known process, the shallow trench isolation insulating film 132, the N type diffusion layer 136 and the $N^+$ type diffusion layer 134 that serve as the source and the drain of the NMOS transistor 142 in the CMOS circuit section 104, and the P type diffusion layer 146 and the $P^+$ type diffusion layer 144 that serve as the source and the drain of the PMOS transistor 152 in the CMOS circuit section 104 are formed. The gate insulating film 128 of the charge transfer section 108, the gate insulating film 138 of the NMOS transistor 142, and the gate insulating film 148 of the PMOS transistor 152 are formed. Further, the charge transfer electrode 130 of the charge transfer section 108, the gate electrode 140 of the NMOS transistor 142, and the gate electrode 150 of the PMOS transistor 152 are formed (see FIG. 3). Through this process, the solid-state image sensing device 200 can be manufactured.

Hereinafter, advantages of the solid-state image sensing device 200 and the manufacturing method therefore will now be described.

According to this embodiment, the first N type semiconductor region 180, the second N type semiconductor region 116, and the N well 182 have substantially same impurity concentration-depth profile. By forming the first N type semiconductor region 180, the second N type semiconductor region 116, and the N well 182 in the same process, the number of manufacturing process can be further reduced. Therefore, in addition to the advantages exhibited by the first embodiment, it is possible to effectively suppress the application of excessive heat history to the solid-state image sensing device 200 during the ion implantation and diffusion of N type impurity. The yield of the solid-state image sensing device 200 can be further improved, accordingly.

In the method for manufacturing the solid-state image sensing device 200, the first N type semiconductor region 180, the second N type semiconductor region 116, and the N well 182 are formed in the same process. It is, therefore, possible to further decrease the number of manufacturing process for the solid-state image sensing device 200. The manufacturing cost of the solid-state image sensing device 200 can be reduced, accordingly.

Moreover, by forming the P well 118 and the P well 120 in the same process, the solid-state image sensing device 200 according to the present embodiment can exhibit the same advantages as those of the solid-state image sensing device 100 according to the first embodiment.

Third Embodiment

In each of the first embodiment and the second embodiment, the solid-state image sensing device that is a CCD sensor including the charge transfer section that consists of the CCD shift register has been described. In the present embodiment, a solid-state image sensing device 220 serving as a CMOS sensor that does not include the charge transfer section 108, as compared with the solid-state image sensing device 100 shown in FIG. 2 will be described. The solid-state image sensing device 220 is substantially equal in the other configurations to the solid-state image sensing device 100 shown in FIG. 2.

FIG. 4 is a schematic cross-sectional view of the solid-state image sensing device 220 according to this embodiment.

In the solid-state image sensing device or CMOS sensor 220, a MOS transistor (not shown in the drawings) is connected to a photodiode (not shown in the drawings) of the photosensor section 106 corresponding to each pixel. That is, an image sensor section (region) 158 of the CCD sensor 220 does not include the charge transfer section differently from the CCD sensor according to the above embodiments. Due to this, the solid-state image sensing device 220 shown in FIG. 4 has substantially same configuration as the solid-state image sensing device 100 (shown in FIG. 1) according to the first embodiment except for not comprising the charge transfer section. In this embodiment, therefore, the first N type semiconductor region 124 and the N well 122 of the solid-state image sensing device 220 are formed in the same process and have substantially same N type impurity concentration-depth profile. For example, a depth of each of the first N type semiconductor region 124 and the N well 122 is about 1 micrometer and an impurity concentration thereof in vicinity of the face is about 1E16 $cm^{-3}$. The expression "substantially same" is intended to allow fluctuation on manufacturing process.

Hereinafter, a method for manufacturing the solid-state image sensing device 220 according to this embodiment will be described.

The solid-state image sensing device 220 does not include the charge transfer section and the second N type semiconductor region differently from the solid-state image sensing device 100 and the solid-state image sensing device 200 according to the first embodiment and the second embodiment. Therefore, the solid-state image sensing device 220 can be manufactured (as shown in FIG. 4) by removing the process of forming the charge transfer section 108 including the second N type semiconductor region 126 from the manufacturing process in the first embodiment shown in FIGS. 7A to 8B.

The solid-state image sensing device 220 exhibits the same advantages as those of the solid-state image sensing device 100 according to the first embodiment. Further, by forming the P well 118 and the P well 120 in the same process, the solid-state image sensing device 220 according to the present embodiment can exhibit the same advantages as those of the solid-state image sensing device 100 according to the first embodiment.

Fourth Embodiment

FIG. 5 is a schematic cross-sectional view of a solid-state image sensing device 240 according to the present embodiment. The cross section of the image sensor section (region) 160 is taken along the line a-a' of FIG. 1.

In the first embodiment, the instance in which the first N type semiconductor region 124 and the N well 122 are formed in the same process has been described. In this embodiment, an instance in which the second N type semiconductor region 184 that is the second first-conductivitytype semiconductor region and the N well 186 that is the first conductivity type well are formed in the same process will be described.

The first N type semiconductor region 164 is formed in a different process from a process of forming the N well 186 and the second N type semiconductor region 184. The N type impurity concentration-depth profile thereof differs from those of the second N type semiconductor region 184 and the N well 186. In this embodiment, the solid-state image sensing device 240 has substantially same configuration as the other configurations to the solid-state image sensing device 100 according to the first embodiment. In addition, the solid-state image sensing device 240 according to this embodiment can be applied to a solid-sate imaging device that is a CCD sensor including a charge transfer section consisting of a CCD shift register.

In the solid-state image sensing device 240, the second N type semiconductor region 184 and the N well 186 are implanted with ions of N type impurity, for example, phosphorus in the same process and have substantially same N type impurity concentration-depth profile. In addition, the P well 118 and the P well 120 are formed in the same process. For example, a depth of each of the second N type semiconductor region 184 and the N well 186 is about 0.8 micrometer and a concentration of N type impurity such as phosphorus in vicinity of the face is about 1E16 $cm^{-3}$, which concentration is higher than that of the N type semiconductor substrate 114. The expression "substantially same" is intended to allow fluctuation on manufacturing process.

The first N type semiconductor region 164 is formed in a different process from a process of forming the second N type semiconductor region 184 and the N well 186. For example, a depth of the first N type semiconductor region 164 is about 1 micrometer and a concentration of N type impurity such as phosphorus in vicinity of the face is about 1E16 $cm^{-3}$. In this case, the depth of the second N type semiconductor region 184 is preferably shallower than that of the first N type semiconductor region 164.

Hereinafter, a method for manufacturing the solid-state image sensing device 240 according to the present embodiment will be described.

In the present embodiment, firstly, the process shown in FIGS. 7A to 7B described in the first embodiment is employed.

Figure 10A:
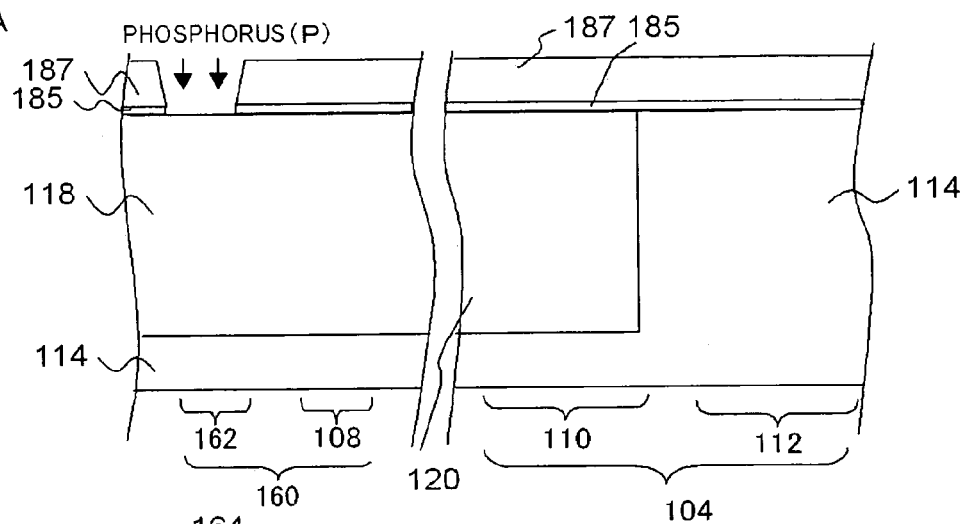
FIGS. 10A to 10C are cross-sectional process views that schematically show manufacturing process for the solid-state image sensing device according to the embodiment of the present invention.
Figure 10B:
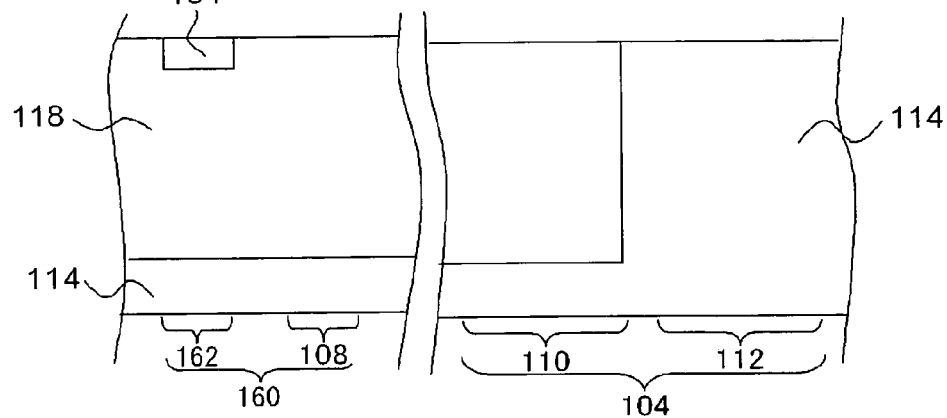

Next, as shown in FIG. 10A, an oxide film 185 and a photoresist 187 are formed on the entire face of the N type semiconductor substrate 114 except for the photosensor section 162 of the image sensor section 160. The photosensor section 162 is subjected to selective ion implantation and heat treatment, thereby forming the first N type semiconductor region 164 of the photosensor section 162. The oxide film 185 and the photoresist 187 are removed after the ion implantation and before the heat treatment. In this ion implantation, ions of N type impurity, for example, phosphorus are implanted at implantation energy of about 80 keV and an amount of an implantation of about 3E12 $cm^{-2}$. As a result, the first N type semiconductor region 164 having the depth of, for example, about 1 micrometer and the phosphorus concentration in vicinity of the face of, for example, about 1E16 $cm^{-3}$ is formed (see FIG. 10B).

Figure 10C:
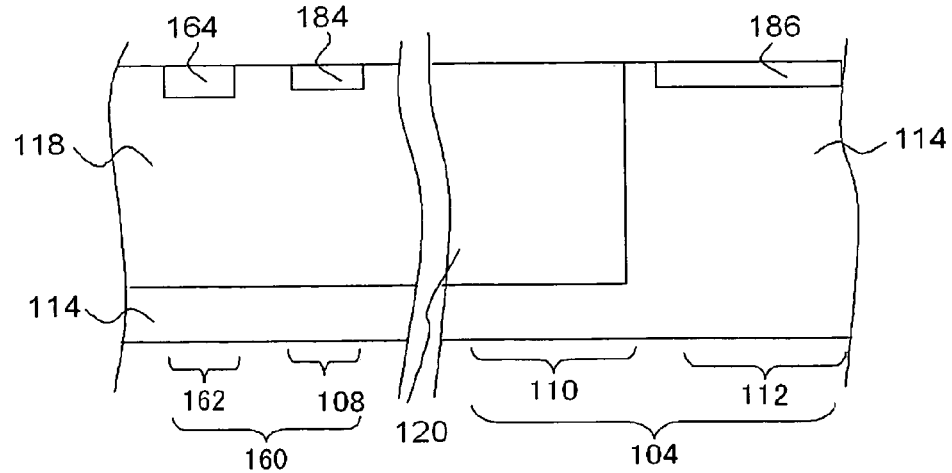

Next, an oxide film (not shown in the drawings) and a photoresist (not shown in the drawings) are formed on the entire face of the substrate 114 except for the charge transfer section 108 and the PMOS region 112. The charge transfer section 108 and the PMOS region 112 are selectively implanted with ions of N type impurity, for example, phosphorus at implantation energy of about 80 keV and an amount of an implantation of about 3E12 $cm^{-2}$ at same time. The oxide film (not shown in the drawings) and the photoresist (not shown in the drawings) are then removed and heat treatment is then performed, thereby simultaneously forming the second N type semiconductor region 184 of the charge transfer section 108 and the N well 186 of the PMOS region 112 in the same process. By doing so, the second N type semiconductor region 184 and the N well 186 each having a depth of, for example, about 0.8 micrometer and a concentration of N type impurity such as phosphorus in vicinity of the face of, for example, about 1E16 $cm^{-3}$ are formed while considering the influence of the heat treatment on later process (see FIG. 10C). As such, the first N type semiconductor region 164 is formed in the different process from the process of forming the second N type semiconductor region 184 and the N well 186. Due to this, the first N type semiconductor region 164 differs in N type impurity concentration-depth profile from the second N type semiconductor region 184 and the N well 186.

Next, using a known process, a shallow trench isolation insulating film 132, the N type diffusion layer 136 and the $N^+$ type diffusion layer 134 that serve as the source and the drain of the NMOS transistor 142 in the CMOS circuit section 104, and the P type diffusion layer 146 and the $P^+$ type diffusion layer 144 that serve as the source and the drain of the PMOS transistor 152 in the CMOS circuit section 104 are formed. The gate insulating film 128 of the charge transfer section 108, the gate insulating film 138 of the NMOS transistor 142, and the gate insulating film 148 of the PMOS transistor 152 are formed. Further, the charge transfer electrode 130 of the charge transfer section 108, the gate electrode 140 of the NMOS transistor 142, and the gate electrode 150 of the PMOS transistor 152 are formed (see FIG. 5). Through this process, the solid-state image sensing device 240 can be manufactured.

The second N type semiconductor region 184 and the N well 186 are formed in the same process and substantially equal in N type impurity concentration-depth profile. The solid-state image sensing device 240 according to the present embodiment can, therefore, exhibit the same advantages as those of the solid-state image sensing device 100 according to the first embodiment.

In addition, the second N type semiconductor region 184 of the charge transfer section 108 and the N well 186 of the PMOS region 112 are formed simultaneously. The method for manufacturing the solid-state image sensing device 240 according to this embodiment can, therefore, exhibit the same advantages as those of the method for manufacturing the solid-state image sensing device 100 according to the first embodiment.

Further, the P well 118 of the image sensor section 160 and the P well 120 of the NMOS region 110 are formed in the same process and made substantially equal in P type impurity concentration-depth profile. The solid-state image sensing device 240 according to the present embodiment can, therefore, exhibit the same advantages as those of the first embodiment.

Fifth Embodiment

FIG. 6 is a schematic cross-sectional view of a solid-state image sensing device 260 according to the present embodiment. Similarly to the first embodiment, the cross section of the image sensor section (region) 166 is taken along the line a-a' of FIG. 1.

The solid-state image sensing device 260 according to the present embodiment differs from the solid-state image sensing device 100 according to the first embodiment in that a P type semiconductor region 170 that is the second conductivity type semiconductor region is formed in a region at a depth of about 0.2 micrometer from the face in an upper portion of the first N type semiconductor region 164. The P type semiconductor region 170 is implanted with ions of P type impurity, for example, boron and a boron concentration thereof in vicinity of the face is about $1E17$ cm$^{-3}$, for example. The solid-state image sensing device 260 has substantially same configuration as the configuration of the solid-state image sensing device 100 according to the first embodiment except that the P type semiconductor region 170 is formed.

By forming the P type semiconductor region 170 in vicinity of the face in the upper portion of the first N type semiconductor region 164, electrons from the first N type semiconductor region 164 resulting from, for example, thermal excitation other than those resulting from optical excitation can be trapped. That is, noise generated in the solid-state image sensing device 260 can be reduced.

Hereinafter, a method for manufacturing the solid-state image sensing device 260 will be described.

In this embodiment, after forming the respective regions similarly to the first embodiment (see FIGS. 7A to 8B), the first N type semiconductor region 164 is selectively implanted with ions of P type impurity, for example, boron at implantation energy of about 50 keV and an amount of an implantation of about $1E13$ cm$^{-2}$. The P type semiconductor region 170 is thereby formed in the upper portion of the first N type semiconductor region 164. Thus, the P type semiconductor region 170 having a depth of, for example, about 0.2 micrometer and a concentration of P type impurity such as boron in vicinity of the face of, for example, about $1E17$ cm$^{-3}$ can be formed (see FIG. 6). Through this process, the solid-state image sensing device 260 can be manufactured.

Hereinafter, advantages of the solid-state image sensing device 260 will be described.

The solid-state image sensing device 260 according to this embodiment can exhibit the same advantages as those described in the first to the fourth embodiments. In addition, by forming the P type semiconductor region 170 in vicinity of the face in the upper portion of the first N type semiconductor region 164, electrons from the first N type semiconductor region 164 resulting from, for example, thermal excitation other than those resulting from optical excitation can be trapped. Due to this, the noise generated in the solid-state image sensing device 260 can be reduced.

Moreover, by forming the P well 118 and the P well 120 in the same process, the solid-state image sensing device 260 according to the present embodiment can exhibit the same advantages as those according to the first embodiment. Besides, the noise generated in the solid-state image sensing device 260 can be reduced.

The configuration of this embodiment can be applied to each of the above embodiments, in which case the above-described advantages can be exhibited.

The embodiments of the present invention have been described so far with reference to the drawings. It should be noted, however, that these embodiments are given only for illustrative purposes and various other configurations can be adopted.

For example, in the embodiments described above, the instance of employing the N type semiconductor substrate 114 as the semiconductor substrate has been described. Alternatively, a P type semiconductor substrate may be employed as the semiconductor substrate. In addition, the respective conductive regions such as wells may have opposite conductivity types to those described above.

In the embodiments described above, the instance of forming the P well of the image sensor section and the P well of the CMOS circuit section in the same process has been described. Alternatively, the P well 118 of the image sensor section 102 and the P well 120 of the CMOS circuit section 104 may be formed in different process according to the respective characteristics.

It is apparent that the present invention is not limited to the above embodiment, that may be modified and changed without departing from the scope and spirit of the invention.

What is claimed is:

1. A solid-state image sensing device comprising:
   a semiconductor substrate;
   an image sensor section formed on said semiconductor substrate and including a PN junction type photosensor; and
   a CMOS circuit section formed on said semiconductor substrate,
   wherein said image sensor section comprises:
   a second conductivity type well; and
   a first first-conductivity-type semiconductor region formed within said second conductivity type well, said first first-conductivity type semiconductor region and said second conductivity type well constituting said PN junction type photosensor,
   said CMOS circuit section comprises:
   a first conductivity type well formed within said substrate; and
   a second conductivity type MOS transistor formed within said first conductivity type well, and
   said first conductivity type well and the first first-conductivity-type semiconductor region have substantially same impurity concentration-depth profile.

2. The solid-state image sensing device according to claim 1, wherein said image sensor section further includes a charge transfer section in a different region from a region in which said PN junction photosensor is formed, within said second conductivity type well, and said charge transfer section includes a second first-conductivity-type semiconductor region within said second conductivity type well.

3. The solid-state image sensing device according to claim 2, wherein said second first-conductivity-type semiconductor region has a different impurity concentration-depth profile from that of said first first-conductivity-type semiconductor region and said first conductivity type well.

4. The solid-state image sensing device according to claim 2, wherein said second first-conductivity-type semiconductor region, said first first-conductivity-type semiconductor region, and said first conductivity type well have substantially same impurity concentration-depth profile.

5. The solid-state image sensing device according to claim 1, wherein an impurity concentration of said first conductivity type well is higher than an impurity concentration of said semiconductor substrate.

6. The solid-state image sensing device according to claim 1, wherein said semiconductor substrate has a second conductivity type.

7. The solid-state image sensing device according to claim 1, wherein a depth of said first conductivity type well is shallower than a depth of said second conductivity type well.

8. The solid-state image sensing device according to claim 1, wherein said image sensor section and said CMOS circuit section comprise second conductivity type wells respectively, the second conductivity type wells of said image sensor section and said CMOS circuit section having substantially same impurity concentration-depth profile.

9. A solid-state image sensing device comprising:
a semiconductor substrate;
an image sensor section formed on said semiconductor substrate and including a PN junction type photosensor; and
a CMOS circuit section formed on said semiconductor substrate,
wherein said image sensor section comprises:
a first second conductivity type well;
a first first-conductivity-type semiconductor region formed within said first second conductivity type well, said first first-conductivity type semiconductor region and said first second conductivity type well constituting said PN junction type photosensor; and
said CMOS circuit section comprises:
a second second-conductivity type well;
a first conductivity type MOS transistor formed within said second second-conductivity type well;
a first conductivity type well; and
a second conductivity type MOS transistor formed within said first conductivity type well,
said first second conductivity type well and said second second-conductivity type well have substantially same impurity concentration depth profile, and
said first conductivity type well and the first first-conductivity-type semiconductor region have substantially same impurity concentration-depth profile.

10. The solid-state image sensing device according to claim 1, wherein said semiconductor substrate has a first conductivity type.

11. The solid-state image sensing device according to claim 9, wherein said semiconductor substrate has a first conductivity type.

12. The solid-state image sensing device according to claim 9, wherein an impurity concentration of said first conductivity type well is higher than an impurity concentration of said semiconductor substrate.

13. The solid-state image sensing device according to claim 9, wherein said semiconductor substrate has a second conductivity type.

14. The solid-state image sensing device according to claim 9, wherein a depth of said first conductivity type well is shallower than a depth of said first and second second conductivity type wells.

15. The solid-state image sensing device according to claim 9, wherein said image sensor section further comprises a charge transfer section and a second first conductivity type semiconductor region formed within said first second conductivity type well in said charge transfer section.

16. The solid-state image sensing device according to claim 1, wherein a second conductivity type semiconductor region is further formed in an upper portion of said first first-conductivity-type semiconductor region.

17. The solid-state image sensing device according to claim 9, wherein a second conductivity type semiconductor region is further formed in an upper portion of said first first-conductivity-type semiconductor region.

18. A method for manufacturing a solid-state image sensing device that comprises an image sensor section including a PN junction type photosensor, and a CMOS circuit section, said image sensor section and said CMOS circuit section formed on a semiconductor substrate, the method comprising:
forming a first second-conductivity-type well in said image sensor section on a face of said semiconductor substrate, and forming a second second-conductivity-type well in a first conductivity type MOS transistor forming region, in said CMOS circuit section; and
forming a first conductivity type well within the substrate in a second conductivity type MOS transistor forming region simultaneously with forming a first first-conductivity-type semiconductor region within said first second-conductivity-type well in said image sensor section, the first first-conductivity type semiconductor region and the first second-conductivity-type well forming the PN junction type photosensor.

19. The method for manufacturing a solid-state image sensing device according to claim 18, wherein said semiconductor substrate has a first conductivity type.

20. The method for manufacturing a solid-state image sensing device according to claim 18, wherein an impurity concentration of said first conductivity type well is higher than an impurity concentration of said semiconductor substrate.

21. The method for manufacturing a solid-state image sensing device according to claim 18, wherein said semiconductor substrate has a second conductivity type.

22. A method for manufacturing a solid-state image sensing device that comprises an image sensor section including a PN junction type photosensor and a charge transfer section, and a CMOS circuit section, said image sensor section and said CMOS circuit section formed on a semiconductor substrate, the method comprising:
forming a first second-conductivity-type well in said image sensor section;
forming a second second-conductivity-type well in said CMOS circuit section;
forming a first first-conductivity-type semiconductor region within said first second-conductivity-type well, the first first-conductivity type semiconductor region and the first second-conductivity-type well forming said PN junction type photosensor; and
forming a first conductivity type well in said CMOS circuit section,
wherein said first second-conductivity-type well and said second second-conductivity-type well are simultaneously formed and wherein said first first conductivity type semiconductor region and said first conductivity type well are simultaneously formed.

23. The method for manufacturing a solid-state image sensing device according to claim 22, wherein said semiconductor substrate has a first conductivity type.

24. The method for manufacturing a solid-state image sensing device according to claim 22, wherein an impurity concentration of said first conductivity type well is higher than an impurity concentration of said semiconductor substrate.

25. The method for manufacturing a solid-state image sensing device according to claim 22, wherein said semiconductor substrate has a second conductivity type.

26. A method for manufacturing a solid-state image sensing device that comprises an image sensor section including a PN junction type photosensor and a charge transfer section, and a CMOS circuit section, said image sensor section and said CMOS circuit section formed on a semiconductor substrate, the method comprising:
forming a first second-conductivity-type well within the substrate in said image sensor section;
forming a second second-conductivity-type well within the substrate in a first conductivity type MOS transistor forming region, in said CMOS circuit section;

forming a first first-conductivity-type semiconductor region within said first second-conductivity-type well in said image sensor section, the first first-conductivity type semiconductor region and the first second-conductivity-type well forming the PN junction type photosensor; and forming a first conductivity type well within the substrate in a second conductivity type MOS transistor forming region simultaneously with forming a second first-conductivity-type semiconductor region in a region in which said charge transfer section is formed within said first second-conductivity-type well in said image sensor section.

27. The method for manufacturing a solid-state image sensing device according to claim 26, wherein said semiconductor substrate has a first conductivity type.

28. The method for manufacturing a solid-state image sensing device according to claim 26, wherein an impurity concentration of said first conductivity type well is higher than an impurity concentration of said semiconductor substrate.

29. The method for manufacturing a solid-state image sensing device according to claim 26, wherein said semiconductor substrate has a second conductivity type.

* * * * *